(12) United States Patent
Chua et al.

(10) Patent No.: US 8,039,938 B2
(45) Date of Patent: Oct. 18, 2011

(54) AIRGAP MICRO-SPRING INTERCONNECT WITH BONDED UNDERFILL SEAL

(75) Inventors: Christopher L. Chua, San Jose, CA (US); Bowen Cheng, Palo Alto, CA (US); Eugene M. Chow, Fremont, CA (US); Dirk De Bruyker, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 22 days.

(21) Appl. No.: 12/471,163

(22) Filed: May 22, 2009

(65) Prior Publication Data

US 2010/0295164 A1 Nov. 25, 2010

(51) Int. Cl.
*H01L 23/495* (2006.01)
*H01L 23/02* (2006.01)
*H01L 23/52* (2006.01)
*H01L 23/48* (2006.01)
*H01L 23/34* (2006.01)

(52) U.S. Cl. ........ 257/678; 257/667; 257/692; 257/696; 257/723

(58) Field of Classification Search .................. 257/688, 257/696, 783, 785, 667, 778, 678, 692, 723
See application file for complete search history.

(56) References Cited

U.S. PATENT DOCUMENTS

| | | | |
|---|---|---|---|
| 6,044,548 A * | 4/2000 | Distefano et al. | 29/840 |
| 6,046,910 A * | 4/2000 | Ghaem et al. | 361/760 |
| 6,124,631 A * | 9/2000 | Cardot et al. | 257/667 |
| 6,133,639 A * | 10/2000 | Kovac et al. | 257/778 |
| 6,169,328 B1 * | 1/2001 | Mitchell et al. | 257/778 |
| 6,525,429 B1 * | 2/2003 | Kovac et al. | 257/778 |
| 6,593,648 B2 * | 7/2003 | Emoto | 257/696 |
| 6,870,272 B2 * | 3/2005 | Kovac et al. | 257/778 |
| 7,148,560 B2 * | 12/2006 | Lee et al. | 257/667 |
| 7,394,153 B2 * | 7/2008 | Auch et al. | 257/704 |
| 7,426,117 B2 * | 9/2008 | Van Schuylenbergh et al. | 361/760 |
| 2004/0061220 A1 * | 4/2004 | Miyazaki et al. | 257/723 |
| 2004/0218135 A1 * | 11/2004 | Lee et al. | 349/156 |
| 2005/0269714 A1 * | 12/2005 | Akram et al. | 257/778 |
| 2008/0284046 A1 * | 11/2008 | Karashima et al. | 257/778 |

* cited by examiner

*Primary Examiner* — Minh-Loan T Tran
*Assistant Examiner* — Teresa M Arroyo
(74) *Attorney, Agent, or Firm* — Marger Johnson & McCollom, P.C.

(57) ABSTRACT

A package includes a pad chip having contact pads, a spring chip having micro-springs in contact with the contact pads to form interconnects, the area in which the micro-springs contact the contact pads forming an interconnect area, an assembly material between the pad chip and the spring chip arranged to form a gap between the pad chip and the spring chip, and an underfill material in a portion of the gap to form a mold from the pad chip and the spring chip. A package includes a pad chip having contact pads, a spring chip having micro-springs in contact with the contact pads to form interconnects, the area in which the micro-springs contact the contact pads forming an interconnect area, an assembly material between the pad chip and the spring chip arranged to form a gap between the pad chip and the spring chip, an underfill material in the gap to form a mold from the pad chip and the spring chip, and at least one wall between the underfill material and the interconnect area. A method of assembling a package includes aligning a pad chip with a spring chip to form at least one interconnect in an interconnect area, adhering the pad chip to the spring chip so that there is a gap between the pad chip and the spring chip, dispensing underfill material into the gap to seal the interconnect area from an environment external to the package, and curing the underfill material to form a solid mold.

17 Claims, 5 Drawing Sheets

US 8,039,938 B2

AIRGAP MICRO-SPRING INTERCONNECT WITH BONDED UNDERFILL SEAL

BACKGROUND

Micro-spring packages generally involve an integrated circuit arranged on a substrate where the integrated circuit has contact pads, referred to here as the pad chip. Another circuit package having protruding contact springs, referred to here as the spring chip, is aligned with the pad chip such that the springs contact the pads. An adhesive holds the springs in contact with the pads.

The process typically includes dispensing an uncured adhesive onto the pads prior to being brought into contact with the springs. Once the springs contact the pads, the adhesive is cured, converting it into a robust, solid mold. Curing may include exposing the adhesive to UV light. An example of such a process is given in U.S. Pat. No. 6,213,789, "Method and Apparatus for Interconnecting Devices Using an Adhesive," issued Apr. 10, 2001.

However, this approach does not scale well for packages having thousands of spring interconnects contacting large sized pads. The contacts fail when subjected to even mild thermal soaks. One issue that arises from the size of the pads. Generally, UV curing involves exposing the adhesive to UV light from underneath the pad. The larger pads block the light, resulting in partially cured adhesive. When the partially cured adhesive heats up in a thermal soak, it can migrate into the contact area, causing the contacts to fail. This thermally-induced effect means using thermally set adhesives instead of UV-cured adhesives would also result in similar contact failures.

DETAILED DESCRIPTION OF THE EMBODIMENTS

Figure 1:
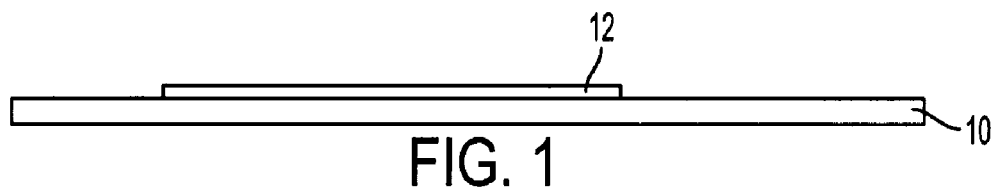
FIGS. 1-4 show a current process for manufacture of a spring interconnect and the resulting interconnect.

FIGS. 1-4 show an embodiment of a current process for manufacture of a spring interconnect package. FIG. 1 shows a 'pad chip' 10 having at least one contact pad 12. The pad chip generally consists of a substrate 10, which may be glass, ceramic, semiconductor, or a flexible organic substrate, as examples. The contact pad may reside on a device, not shown, or directly on the substrate.

Figure 2:
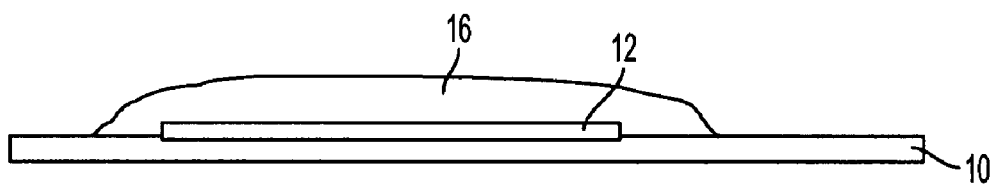

FIG. 2 shows the pad chip being prepared for packaging with a spring chip. This generally involves dispensing an adhesive or other type of mold compound 16 over the pad chip. When the spring chip is mated to the pad chip, this compound is cured and creates a solid and robust mold around the interconnect. The contact between the contact pad and the spring will be referred to as the interconnect, and the area in which multiple interconnects are made between the two chips will be referred to as the interconnect area. At least one of the pad chip and the spring chip may contain electronic devices, the term electronic devices including photo-electronic devices (photonic devices). These may include transistors, photodetectors, light emitting diodes (LEDs), and laser diodes.

In an embodiment, the springs on the spring chip are batch-fabricated using stress-engineered thin films. The films are sputter-deposited with a built-in stress gradient so that, when patterned and released from their substrate, they curl out of the wafer plane with a designed radius of curvature. Stress engineering is accomplished by controlling the ambient pressure during film deposition. Many refractory metals have a common property of acquiring tensile stress when sputtered at high pressures and compressive stress when sputtered at low pressures. One such metal is, for example, a molybdenum-chromium (MoCr) alloy. The exact stress-versus-pressure behavior is a function of the specific sputter tool geometry, the type of substrate used, and other process parameters. In one sputter setup, MoCr films sputtered below pressures of 2.35 mTorr produce compressive films, while those sputtered at higher deposition pressures produce tensile films. The effect allows one to readily and reproducibly dial in a stress values ranging from −2 GPa to +2 GPa just by changing the sputter pressure.

A stress gradient is induced by simply changing the ambient pressure during film deposition. A film that is compressive at the bottom and tensile on the surface is, for example, realized by increasing the pressure during sputtering. In practice, this pressure control is accomplished by flowing Argon and widening or narrowing an orifice opening to the pump. When patterned and released, such a stress-graded film curls up out of the wafer plane to form springs. Once released from the substrate the springs can be coated or plated to adjust its electrical and physical properties.

Figure 3:
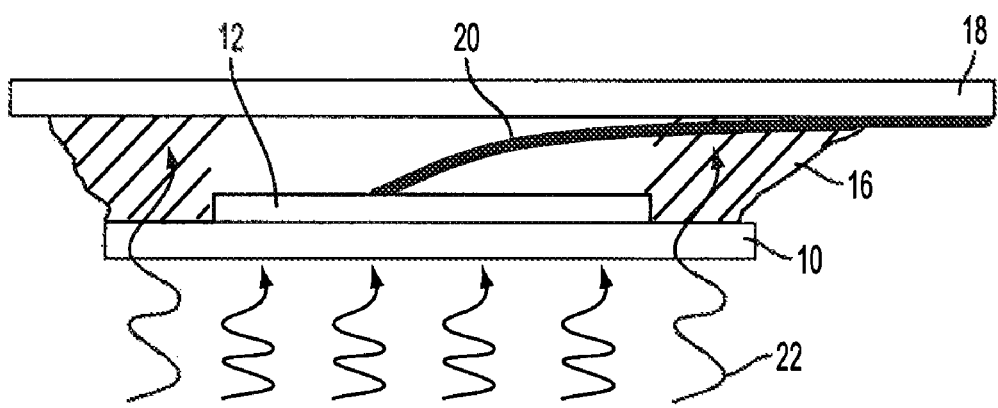

Once the two chips are aligned, they are brought into contact, as shown in FIG. 3. The molding compound or adhesive 16 seals the package from the environment, as well as protecting the interconnect between the spring 20 and the contact pad 12. At this point, the molding compound 16 is still pliable, allowing the spring 20 to penetrate and make connection with the contact pad 12. In this embodiment, the molding compound cures upon exposure to ultraviolet (UV) light, shown by arrows such as 22.

Figure 4:
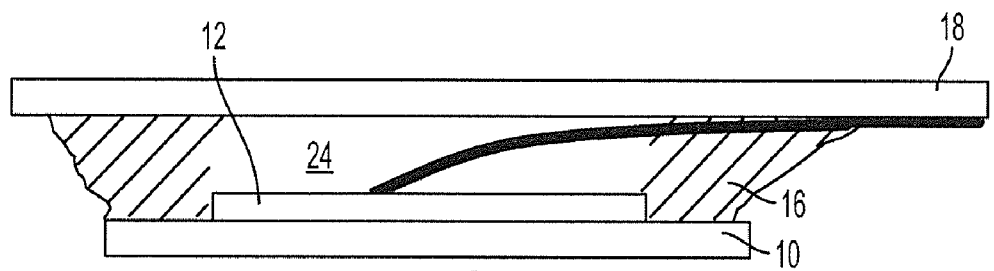

In this embodiment, the substrate 10 upon which the pad 12 resides is glass or other transparent material. However the pad 12 blocks the UV light from curing part of the molding compound 16. This may also be true if the pad 12 resides on a device, where the device would also block the curing light. FIG. 4 shows the region 24 that consists of insufficiently cured adhesive. The adhesive is insufficiently cured in that when exposed to heat during thermal cycling of the device's operation, some of the adhesive may migrate into the area of the interconnection and cause the interconnection to fail. Use of thermally set adhesives or molding compounds would not alleviate this problem, as the application of heat to set the adhesive would generally cause relative movements that result in migration of insulating materials into the interconnection.

Experiments have found that the package disclosed above does not scale to packages containing thousand of spring interconnects contacting large size pads. Electrical contacts for these packages tend to fail subjected to even mild thermal soaks. The below table lists electrical resistances of different daisy chain interconnects after a thermal soak at 90° C. after 65 hours. Many daisy chain interconnects developed contact failures. It should be noted that no further contact failures occurred after the initial set of failures. Good contacts remained good when subjected to further thermal cycling or humidity soaks.

| Daisy Chain ID | Number of Contacts | After package assembly ohms/contact | After 90° C. soak for 65 hours ohms/contact | After 24 100° C./0° C. thermal cycles ohms/contact |
|---|---|---|---|---|
| 1 | 2 | 3.11 | Open | open |
| 2 | 2 | 1.77 | 1.70 | 1.72 |
| 3 | 2 | 1.79 | 1.80 | 1.85 |
| 4 | 2 | 3.31 | 3.27 | 3.28 |
| 5 | 2 | 5.04 | 4.92 | 4.92 |
| 6 | 2 | 4.39 | 4.30 | 4.31 |
| 7 | 2 | 4.51 | 4.43 | 4.44 |
| 8 | 2 | 5.15 | 5.07 | 5.11 |
| 9 | 8 | 1.21 | 1.27 | open |
| 10 | 8 | 1.22 | 1.21 | 1.25 |
| 11 | 28 | 0.21 | 0.26 | 0.30 |
| 12 | 28 | 0.22 | 0.22 | 0.22 |
| 13 | 42 | 0.40 | Open | open |
| 14 | 42 | 0.40 | 0.46 | 0.73 |
| 15 | 134 | 0.32 | Open | open |
| 16 | 134 | 0.33 | 0.32 | 0.33 |
| 17 | 246 | 0.35 | Open | open |
| 18 | 246 | 0.35 | Open | open |
| 19 | 384 | 0.31 | Open | open |
| 20 | 530 | 0.30 | Open | open |
| 21 | 530 | 0.31 | 0.31 | 0.34 |

The first column in table 1 lists the identification number of each daisy chain in the package. The second column lists the number of interconnects contained within each daisy chain. The third column lists the normalized resistance measured for each chain after package assembly but before any reliability stress test. The fourth column indicates the effect of placing the package in a 90° C. oven for 65 hours. Seven daisy chains suffered contact failures after this thermal soak. Chains containing more interconnects were more prone to failures because even a single contact failure would produce an open circuit. Column 5 shows what happened when the package was subjected to subsequent thermal cycling. It appeared that the initial thermal soak stabilized the package, so no further contact failures occurred during the more aggressive thermal cycling.

Experiments indicate that the contact failures in Table 1 are likely caused by insufficiently cured adhesive creeping between the spring/pad interface during the thermal soak. FIG. 3 shows the adhesive curing process in a package that contains large-size contact pads. In this case, the adhesive is cured by illuminating the adhesive with ultra-violet light through a transparent glass wafer. The large contact pad 12 obscures a significant portion of ultraviolet light from reaching the critical spring/pad interface as shown in FIG. 3, so adhesive around that region 24 remains uncured, shown in FIG. 4.

When the package is subjected to thermal stress, uncured adhesive can migrate into the spring/pad interface causing contact failures. Since elevated temperatures also cure the adhesive, packages that have undergone thermal soak will no longer contain uncured adhesive. This thermal curing of adhesive explains the data in the table showing that interconnects that survive the initial thermal soak remain good when subjected to subsequent thermal cycling. The experiment also suggested that using temperature to do a primary adhesive cure is not a good option for forming the mold because the thermal soak process causes contact failures.

Figure 5:
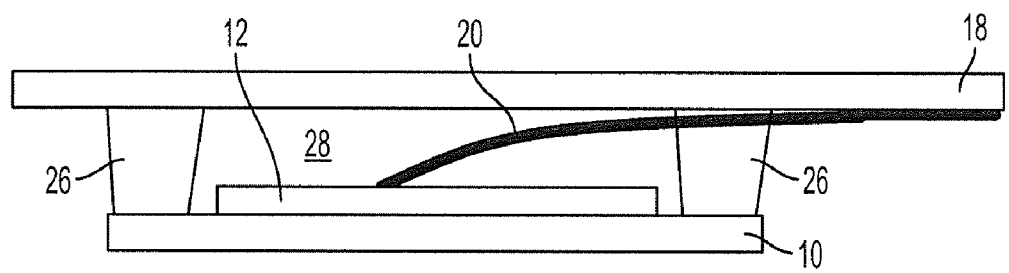
FIG. 5 shows an embodiment of an air gap micro-spring interconnect.

FIG. 5 shows an embodiment of a spring interconnect package that does not suffer from the issues discussed above. In FIG. 5, the spring chip 18 and the pad chip 10 are brought into alignment without covering the contact pad 12 with adhesive or molding compound. Instead, adhesive 26 is selectively applied at small, localized areas such as at the corners, center or edges of the package. The spring contact area has an air gap 28. This localized placement and the smaller amount avoid the interference with the spring contact area discussed above.

However, the localized placement of adhesive leaves behind large open gaps, which exposes the interconnect area to the environment. In some interconnect designs, the contact area is placed sufficiently far from the wafer boundary. Adhesive may be applied around the entire periphery surrounding the interconnect area without adhesive creeping into it. Advantages exist in sealing off the interconnect area by surrounding it with adhesive underfill during package alignment and assembly in protecting the interconnect area from the environment.

Figure 6:
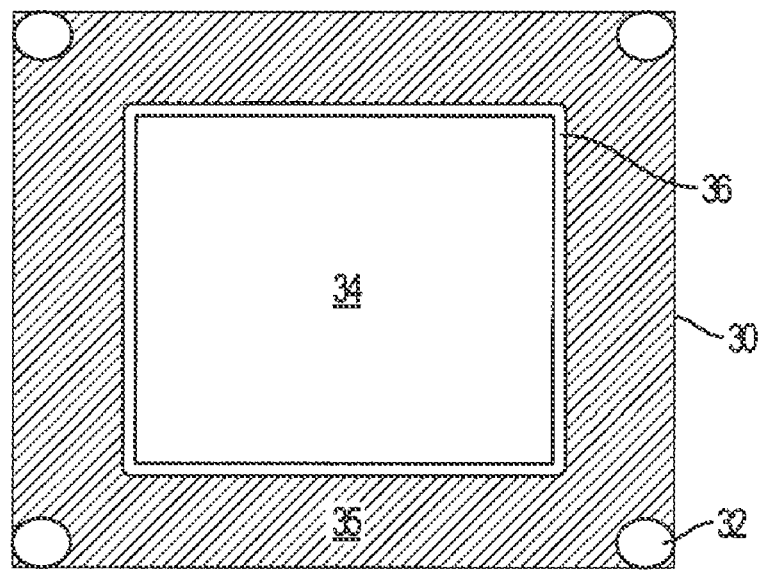
FIG. 6 shows an embodiment of an air gap micro-spring interconnect having a sealed off interconnect area and underfill.

For interconnect designs where applying adhesive around the entire periphery is problematic, one can apply adhesive at only select spot locations. FIG. 6 shows an example of a package 30, in which adhesive 32 is applied at the 4 corners of the package. The corners are merely examples of localized areas away from the interconnect area 34 in which adhesive may be applied. The adhesive may reside in many places as long as it does not encroach into the interconnect area 34 during package assembly.

Once the package is assembled and the adhesive cured, an underfill material 35 may be applied along the edges of the package. Generally, the underfill will flow into the gap between the two chips by capillary action, at least partially filling the gap and sealing the interconnect area from the environment. The underfill may be an adhesive like the adhesive used during assembly, so the first adhesive may be referred to here as the assembly material and the underfill adhesive may be referred to as underfill. Examples of the assembly material may include various Loctite™ product lines or various curable adhesives, such as thermally-curable, UV-curable, moisture-curable or chemically-curable adhesives.

In order to block the underfill from flowing into the interconnect area, a wall 36 may reside around the interconnect area to keep the underfill from flowing into the interconnect area. The underfill would then be cured to turn it into a solid, with no further issues with flow. The wall may consist of photolithographically defined features out of some sort of material such as polyimide. In one embodiment, the polyimide wall may also act as the assembly adhesive, provided the top of the wall is sufficiently tacky to stick to and hold the spring chip. In addition to functioning as a barrier against underfill encroachment, the wall may also define the gap thickness between to the two chips.

Figure 7:
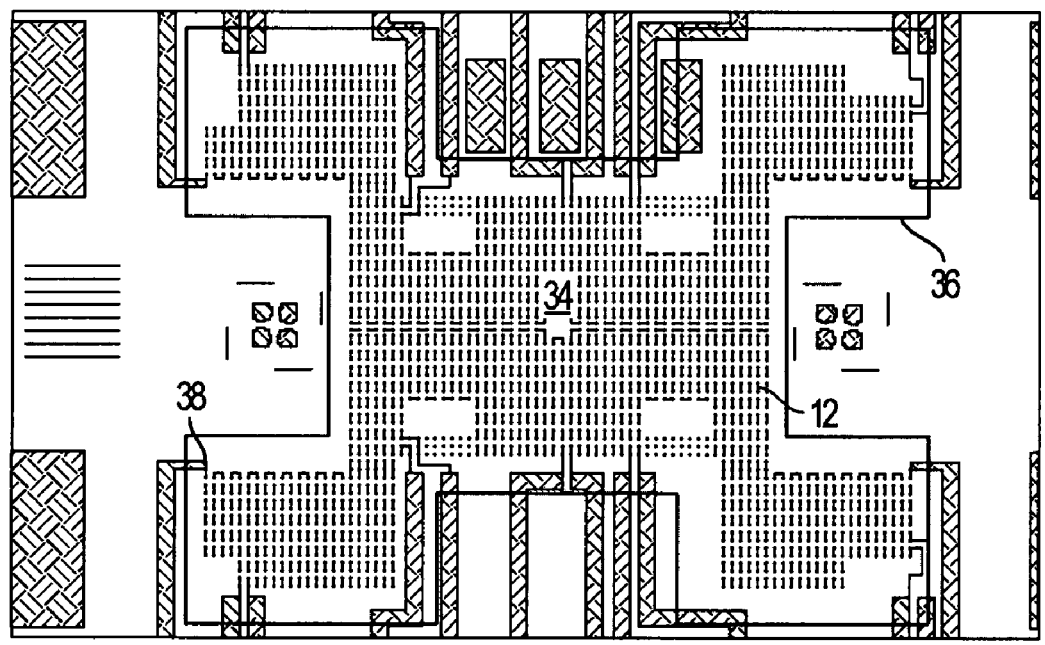
FIG. 7 shows an embodiment of a walled-off interconnect area prior to underfill.

FIG. 7 shows a top view of an embodiment of a pad chip having a border wall surrounding the contact pads in the interconnect area. During assembly, the spring chip is pressed against the wall 36 such that the springs press against the corresponding contact pads such as 12. In one embodiment, the spring chip and the pad chip are pressed against each other to a force of about twice as much as the force that would have been produced by the spring alone, approximately 1.2 Kg of force. Once aligned and pressed, the assembly adhesive is then cured, such as by application of UV light. The result is an air gap package consisting of a fence that allows subsequently applied underfill to completely surround the interconnect area without encroaching into any spring-contact pads.

Note that the wall traverses the interconnect lines, such as 38. The interconnect lines such as 38 electrically connect the contact pads such as 12 inside the interconnect area 34 to test pads at the periphery of the package. The wall may be fully cured during pad chip processing. Some benefits may exist by only partially curing the wall, allowing for increased compliance and conformity to different surface topologies. This compliance may also enable a better seal when compressed during package assembly, as the wall fills any voids in the gap during assembly.

Figure 8:
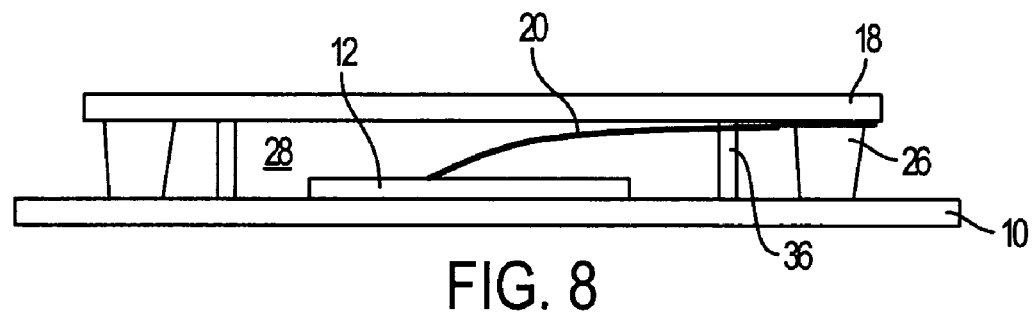
FIG. 8 shows an embodiment of an air gap micro-spring interconnect package prior to underfill.

FIG. 8 shows a cross section of a package prior to application of the underfill. The wall 36 ensures that the air gap 28 in the interconnect area remains unencroached by any adhesive 26. This ensures that the contact between the contact pad 12 on pad chip 10 and the spring 20 on spring chip 18 is not compromised by any other materials. The underfill would fill the space between the adhesive 26 and the wall 36. When cured, the underfill converts the liquid to a solid mold, not only sealing off the interconnect area from the environment, but makes the package mechanically robust.

Figure 9:
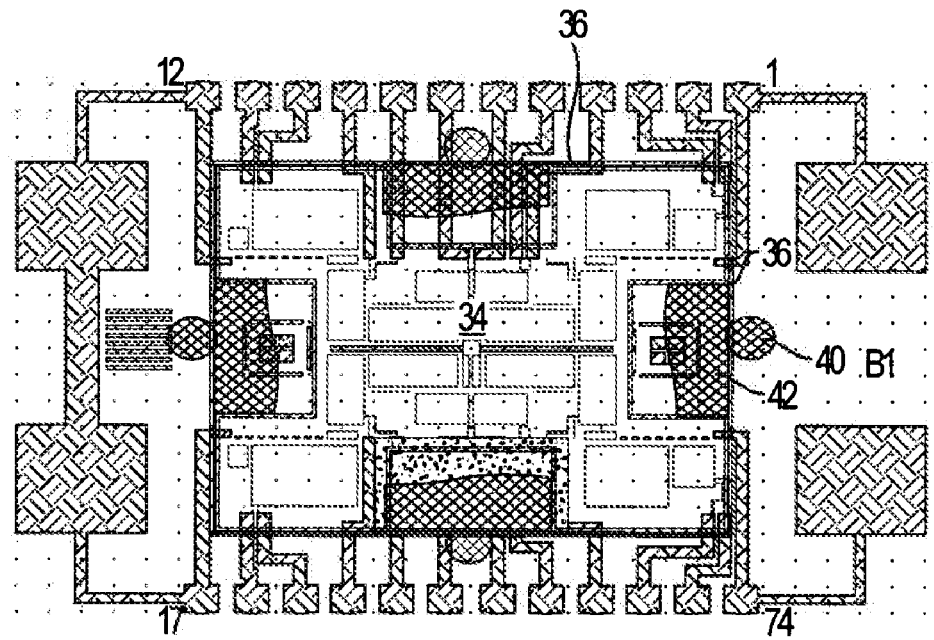
FIG. 9 shows a top view of an air gap micro-spring interconnect package after application of underfill.

FIG. 9 shows a top down view of an embodiment of a package during application of the underfill. The wall 36 defines and protects the interconnect area 34. The underfill in this embodiment is applied by application of a bead 40 of the underfill. Due to capillary action, the underfill material flows into the gap as shown by portion 42. This flowing stops at the wall 36 and the underfill is then hardened to avoid any further flow.

In experiments, electrical contacts in the embodiments of this package survived thermal cycling and humidity reliability tests. In one experiment, the packages were placed in a chamber that cycles the temperature between 100° C. and 0° C. on 40 minute duty cycles. The humidity tests consisted of placing the packages into an 85% relative humidity environment at an elevated temperatures of 85° C. No failures were observed after 2 weeks of testing.

Some packages were also continuously monitored for electrical glitches while being thermal cycled. A single contact failure among the 2844 springs in the package would have caused a test failure. No glitches were detected after 140 hours of thermal cycling. The table below shows the pre and post thermal cycling daisy chain resistances of a package after 141 hours of thermal cycling.

| Daisy Chain ID | Number of Contacts | After package assembly ohms/contact | After thermal cycle for 141 hours ohms/contact |
| --- | --- | --- | --- |
| 1 | 2 | 0.09 | 0.12 |
| 2 | 2 | 0.12 | 0.13 |
| 3 | 2 | 0.10 | 0.13 |
| 4 | 2 | 0.10 | 0.15 |
| 5 | 2 | 0.12 | 0.13 |
| 6 | 2 | 0.13 | 0.13 |
| 7 | 2 | 0.11 | 0.14 |
| 8 | 2 | 0.11 | 0.13 |
| 9 | 2 | 0.10 | 0.12 |
| 10 | 2 | 0.11 | 0.15 |
| 11 | 134 | 0.74 | 0.75 |
| 12 | 134 | 0.74 | 0.75 |
| 13 | 246 | 0.80 | 0.84 |
| 14 | 246 | 0.79 | 0.84 |
| 15 | 384 | 0.67 | 0.78 |
| 16 | 384 | 0.67 | 0.79 |
| 17 | 530 | 0.75 | 0.78 |
| 18 | 530 | 0.75 | 0.77 |

The table below shows the daisy chain resistances of a different package than that shown above, after 88 hours of humidity testing.

| Daisy Chain ID | Number of Contacts | After package assembly ohms/contact | After 85° C. 85% RH soak for 88 hours ohms/contact |
| --- | --- | --- | --- |
| 1 | 2 | 0.12 | 0.12 |
| 2 | 2 | 0.11 | 0.12 |
| 3 | 2 | 0.09 | 0.13 |
| 4 | 2 | 0.09 | 0.18 |
| 5 | 2 | 0.11 | 0.16 |
| 6 | 2 | 0.12 | 0.17 |
| 7 | 2 | 0.13 | 0.13 |
| 8 | 2 | 0.11 | 0.13 |
| 9 | 2 | 0.11 | 0.15 |
| 10 | 2 | 0.11 | 0.21 |
| 11 | 134 | 0.78 | 0.81 |
| 12 | 134 | 0.79 | 0.83 |
| 13 | 246 | 0.83 | 0.89 |
| 14 | 246 | 0.84 | 0.90 |
| 15 | 384 | 0.63 | 0.79 |
| 16 | 384 | 0.65 | 0.83 |
| 17 | 530 | 0.79 | 0.82 |
| 18 | 530 | 0.81 | 0.88 |

Various modifications to this package are also possible, with much the same predicted results. For example, the substrates of either the spring chip, the pad chip, or both, may be glass, silicon, quartz, ceramic, flexible organic substrates, or other semiconductors such as GaAs or InP. Other types of assembly adhesives, other than UV-curable, may also be used, including self-curing, moisture-activated or thermally-curable. The underfill could also be self-curing, moisture-activated, thermally-curable or chemically-activated or -curable materials.

Figure 10:
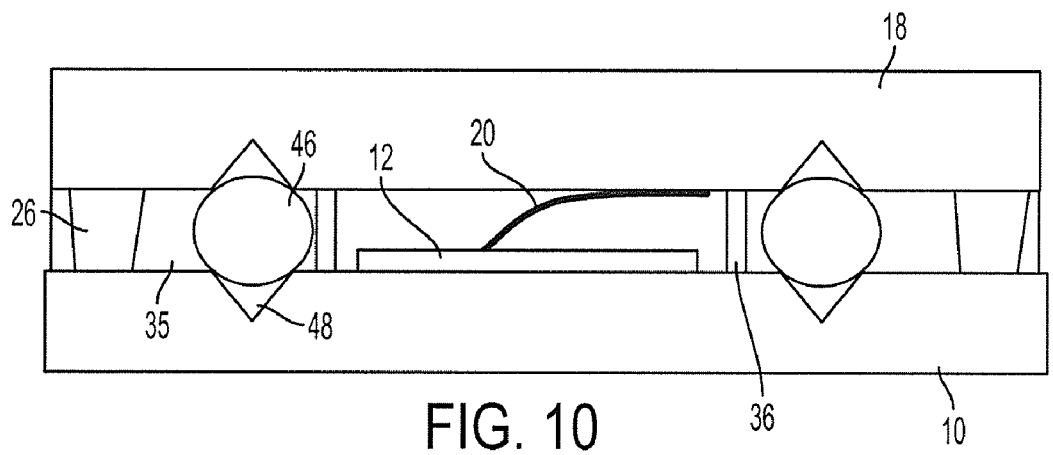
FIG. 10 shows a side view of an alternative micro-spring interconnect package after application of underfill.
Figure 11:
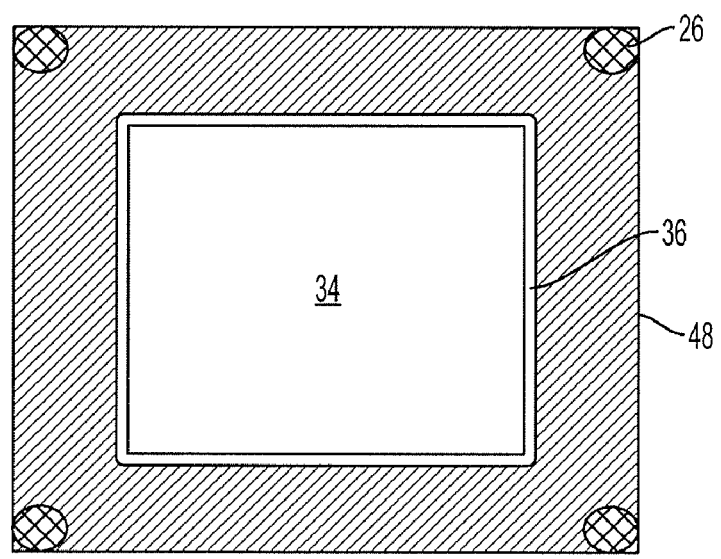
FIG. 11 shows a top view of an alternative micro-spring interconnect package after application of underfill.

Another modification may lie in the wall structure defining the gap. Other types of spacers may be incorporated into the package. This may result from the wall structure not being sturdy enough to function effectively as spacers, or a desire to use a shorter wall, for example. FIG. 10 shows an embodiment employing spacer beads to define the gap. The spacer beads 46 may be placed in alignment pits 48 etched into the pad chip and the spring chip. The beads may be placed at the corners, edges or in the center of the chips. A wall structure 35 would still be employed to stop the underfill from going into the interconnect area. The spacer beads may also be mixed into the assembly adhesive prior to the application of the adhesive. This is shown by the beads 46 mixed with the adhesive 26 in FIG. 11.

Much of the discussion above assumed the presence of a surrounding wall. Depending upon the viscosity of the underfill and how it is applied, no surrounding wall may be necessary. If the underfill is applied so as to not risk encroaching the interconnect area, the wall may be optional. Another alternative is to form several small 'fences' in designated locations, rather than as a surrounding wall.

In this manner, a more robust package is created with higher reliability for larger contact pads and high numbers of spring contacts. The package is sealed from the environment by the underfill, and the interconnect area is protected from any contaminating materials.

It will be appreciated that several of the above-disclosed and other features and functions, or alternatives thereof, may be desirably combined into many other different systems or applications. Also that various presently unforeseen or unanticipated alternatives, modifications, variations, or improve-

What is claimed is:

1. A package, comprising:
a pad chip having a surface with which contact pads are in contact;
a spring chip having micro-springs in contact with the contact pads to form interconnects, an area in which the micro-springs contact the contact pads forming an interconnect area;
an assembly material between the pad chip and the spring chip arranged to form a gap between the pad chip and the spring chip;
an underfill material in a portion of the gap away from the interconnect area to form a mold from the pad chip and the spring chip; and
a wall surrounding the interconnect area to separate the underfill from the interconnect area.

2. The package of claim 1, wherein the assembly material comprises one of a self-curing adhesive, a moisture-activated adhesive, a thermally-curable adhesive, solder, and a UV-curable adhesive.

3. The package of claim 1, wherein the underfill material comprises one of a self-curing sealant, a moisture-activated sealant, a thermally-activated sealant, chemically-activated material, and a UV-curable sealant.

4. The package of claim 1, wherein the wall comprises a material that is compliant to surface topology and adjustable to fill voids in the gap during package assembly.

5. The package of claim 1, wherein the wall comprises a polyimide wall.

6. The package of claim 1, wherein the wall comprises a plurality of walls scattered around the interconnect area.

7. The package of claim 2, further comprising spacer beads in the assembly material arranged to define dimensions of the gap.

8. The package of claim 1, wherein the assembly material comprises an adhesive into which spacer beads are mixed.

9. The package of claim 1, wherein the pad chip further comprises a substrate of one of quartz, ceramic, a flexible organic material, metal, or a semiconductor.

10. The package of claim 1, wherein at least one of the pad chip and the spring chip, contain electronic or photonic devices such as transistors, photodetectors, LEDs, or laser diodes.

11. The package of claim 1, wherein the spring chip further comprise a substrate of one of quartz, ceramic, a flexible organic material, and a semiconductor.

12. A package, comprising:
a pad chip having contact pads;
a spring chip having micro-springs in contact with the contact pads to form interconnects, an area in which the micro-springs contact the contact pads forming an interconnect area;
an assembly material between the pad chip and the spring chip arranged to form a gap between the pad chip and the spring chip;
an underfill material in the gap to form a mold from the pad chip and the spring chip; and
at least one wall between the underfill material and the interconnect area, the wall surrounding the interconnect area with the underfill away from the interconnect area.

13. The package of claim 12, wherein the wall comprises a wall surrounding the interconnect area.

14. The package of claim 12, wherein the wall comprises a plurality of walls arranged around the interconnect area.

15. The package of claim 12, wherein the wall comprises a polyimide wall.

16. The package of claim 12, wherein the wall defines a width of the gap between the pad chip and the spring chip.

17. The package of claim 12, wherein the wall comprises a compliant material.

* * * * *